United States Patent
Ko et al.

(10) Patent No.: US 10,218,308 B2
(45) Date of Patent: Feb. 26, 2019

(54) PHOTOVOLTAIC JUNCTION BOX PROVIDING QUICK HEAT DISSIPATION

(71) Applicants: Tyco Electronics (Shanghai) Co. Ltd., Shanghai (CN); Tyco Electronics Holdings (Bermuda) No. 7 Limited, Hamilton (BM)

(72) Inventors: Shih Ying Ko, Shanghai (CN); Yuan Zhong, Shanghai (CN); Zhenhua Zhang, Shanghai (CN)

(73) Assignees: Tyco Electronics Holdings (Bermuda) No. 7 Limited, Hamilton (BM); Tyco Electronics (Shanghai) Co. Ltd., Shanghai (CN)

(*) Notice: Subject to any disclaimer, the term of this patent is extended or adjusted under 35 U.S.C. 154(b) by 0 days.

(21) Appl. No.: 15/793,122

(22) Filed: Oct. 25, 2017

(65) Prior Publication Data

US 2018/0115278 A1    Apr. 26, 2018

(30) Foreign Application Priority Data

Oct. 25, 2016    (CN) .................... 2016 2 1148186 U

(51) Int. Cl.
| | | |
|---|---|---|
| H02B 1/00 | (2006.01) | |
| H02B 1/56 | (2006.01) | |
| H05K 7/20 | (2006.01) | |
| H02S 40/34 | (2014.01) | |
| H01R 13/66 | (2006.01) | |
| H01R 24/60 | (2011.01) | |
| H02G 3/08 | (2006.01) | |
| H02G 3/14 | (2006.01) | |
| H02G 3/16 | (2006.01) | |
| H01R 107/00 | (2006.01) | |

(52) U.S. Cl.
CPC ....... *H02S 40/345* (2014.12); *H01R 13/6641* (2013.01); *H01R 24/60* (2013.01); *H02G 3/081* (2013.01); *H02G 3/14* (2013.01); *H02G 3/16* (2013.01); *H01L 2224/40* (2013.01); *H01R 2107/00* (2013.01)

(58) Field of Classification Search
CPC .......... H02S 40/345; H02G 3/16; H02G 3/14; H05K 1/0201; H05K 1/0209
USPC .............................. 361/676; 439/485, 620.21
See application file for complete search history.

(56) References Cited

U.S. PATENT DOCUMENTS

| | | | | |
|---|---|---|---|---|
| 9,866,169 | B1* | 1/2018 | Li ......................... | H02S 40/345 |
| 2008/0011348 | A1* | 1/2008 | Aoyama .............. | H01R 9/2425 |
| | | | | 136/244 |
| 2009/0084570 | A1* | 4/2009 | Gherardini ............. | H02S 40/34 |
| | | | | 174/51 |
| 2012/0048614 | A1* | 3/2012 | Xue ........................ | H02G 3/16 |
| | | | | 174/520 |
| 2017/0063298 | A1* | 3/2017 | Lv ........................... | H02S 40/34 |
| 2017/0063299 | A1* | 3/2017 | Zhong ..................... | H02G 3/14 |

(Continued)

*Primary Examiner* — Hae Moon Hyeon
(74) *Attorney, Agent, or Firm* — Barley Snyder

(57) ABSTRACT

A photovoltaic junction box comprises a box body formed of a single integrally-molded part having a housing portion defining a receiving chamber and a packaging portion having a first packaging portion located inside the receiving chamber and a second packaging portion located outside the receiving chamber, a plurality of conductive terminals positioned along the box body and at least one diode chip disposed in a portion of the box body outside of the receiving chamber.

22 Claims, 4 Drawing Sheets

(56) References Cited

U.S. PATENT DOCUMENTS

2017/0133981 A1\* 5/2017 Li .................... H01L 23/3114
2017/0163211 A1\* 6/2017 Lv ......................... H02S 40/34

\* cited by examiner

PHOTOVOLTAIC JUNCTION BOX PROVIDING QUICK HEAT DISSIPATION

CROSS-REFERENCE TO RELATED APPLICATION

This application claims the benefit of the filing date under 35 U.S.C. § 119(a)-(d) of Chinese Patent Application No. 201621148186.6, filed on Oct. 25, 2016.

FIELD OF THE INVENTION

The present invention relates to a photovoltaic junction box and, more particularly, to a photovoltaic junction box having a box body and a plurality of conductive terminals.

BACKGROUND

A photovoltaic junction box comprises a box body, a plurality of conductive terminals, a plurality of diodes, and a cover. Each diode has a diode chip and a diode package packaged on the diode chip. The diode package is commonly formed directly on the diode chip by an insert-molding process and the box body of the photovoltaic junction box is separately injection-molded. Electrodes of the diode chip are wired or directly welded to the corresponding conductive terminals. Each conductive terminal is mounted and secured in a snap-fit manner in a receiving chamber of the box body of the photovoltaic junction box. The cover is mounted on an opening of the receiving chamber of the box body and is adapted to open and close the opening of the receiving chamber.

The conventional photovoltaic junction box has a relatively complicated structure and a relatively complicated manufacturing process, resulting in low processing efficiency and high cost. In addition, in the conventional photovoltaic junction box, the diode chip is located in the receiving chamber of the box body so that the heat generated when the diode chip is operated cannot be quickly dissipated into the air outside the box body, resulting in poor heat dissipation and poor performance.

SUMMARY

A photovoltaic junction box comprises a box body, a plurality of conductive terminals, and at least one diode chip. The at least one diode chip is disposed in the box body.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
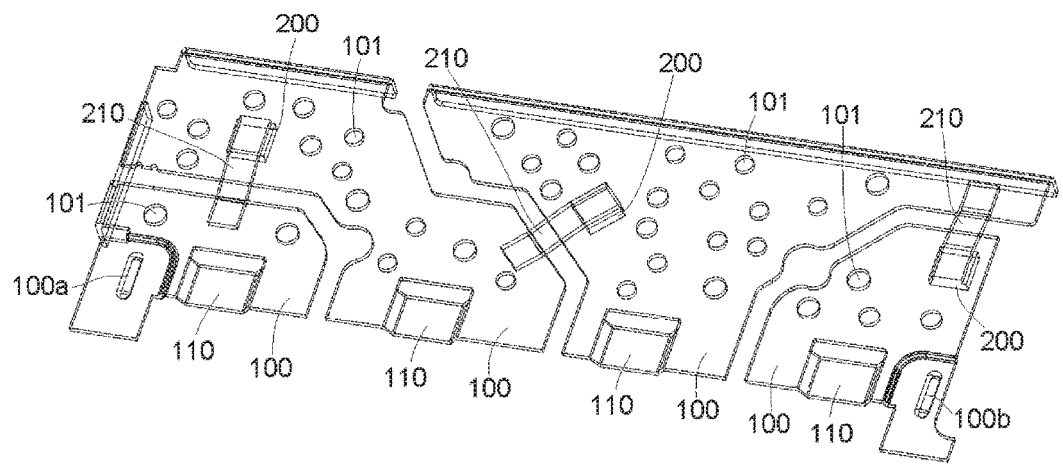
FIG. 1 is a perspective view of a plurality of conductive terminals and a plurality of diode chips of a photovoltaic junction box according to a first embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

Figure 2:
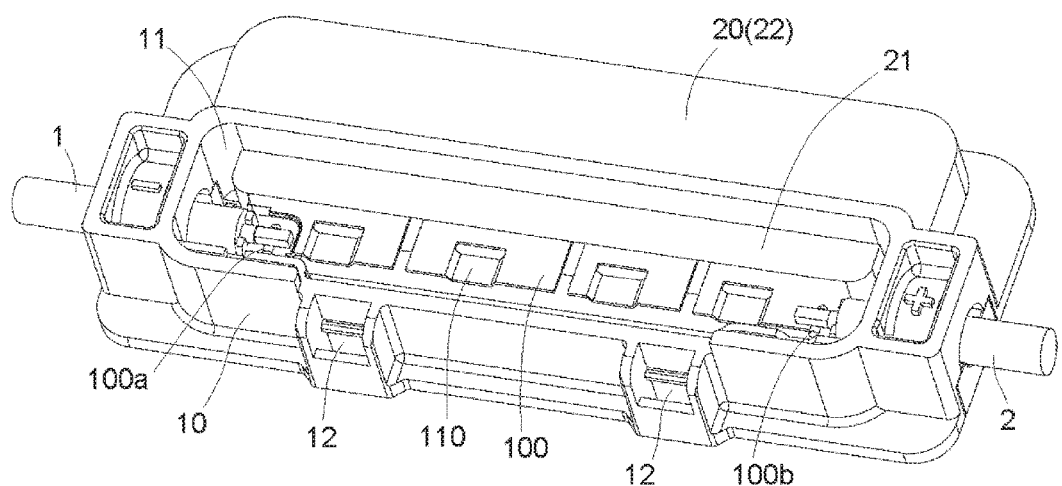
FIG. 2 is a perspective view of the photovoltaic junction box of the first embodiment in which a receiving chamber of the photovoltaic junction box is in an open state.
Figure 3:
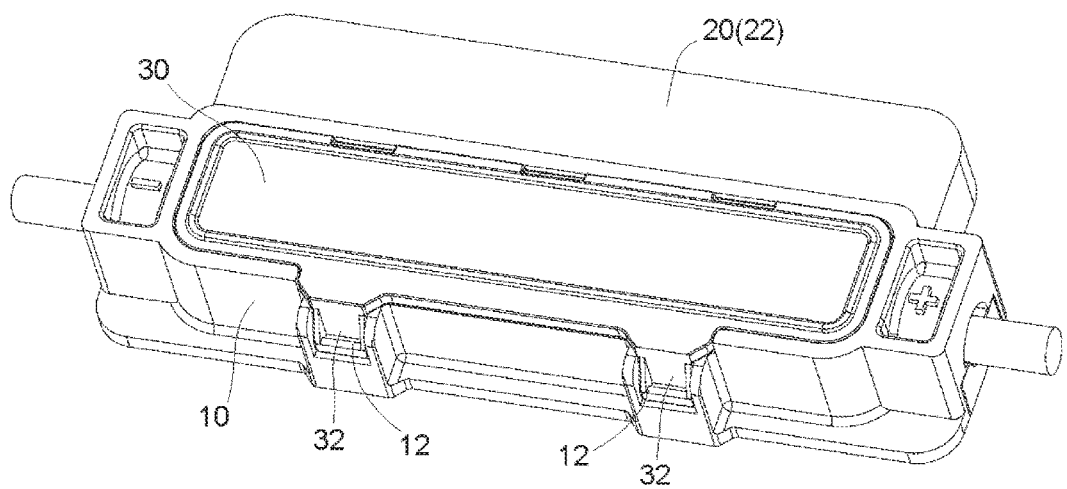
FIG. 3 is a perspective view of the photovoltaic junction box of FIG. 2 in which the receiving chamber is closed by a cover.

A photovoltaic junction box according to an embodiment is shown in FIGS. 1-3. The photovoltaic junction box comprises a box body 10, 20, a plurality of conductive terminals 100, and at least one diode chip 200. In the shown embodiment, the photovoltaic junction box comprises four conductive terminals 100 and three diode chips 200; the four conductive terminals 100 are arranged in a row.

As shown in FIGS. 1 and 2, the diode chips 200 are all directly packaged in the box body 10, 20. In the shown embodiment, there is no need to provide additional packaging for the diode chips 200, thereby simplifying the structure and manufacturing process of the photovoltaic junction box and reducing the manufacturing cost of the photovoltaic junction box.

The box body 10, 20, as shown in FIGS. 1 and 2, is formed with a receiving chamber 11 therein. The diode chips 200 are packaged in the portion 22 of the box body 10, 20 located outside the receiving chamber 11. In the shown embodiment, the box body 10, 20 is a single integrally-molded part. The box body 10, 20 may be molded directly on the diode chips 200 and the conductive terminals 100 by an insert-molding process. In this way, the structure and manufacturing process of the photovoltaic junction box may be greatly simplified, and the manufacturing cost of the photovoltaic junction box may be reduced significantly.

The box body 10, 20, as shown in FIGS. 1 and 2, comprises a housing portion 10 and a packaging portion 20. The receiving chamber 11 is defined in the housing portion 10. The packaging portion 20 includes a first packaging portion 21 located inside the receiving chamber 11 and a second packaging portion 22 located outside the receiving chamber 11. In the shown embodiment, the three diode chips 200 are directly packaged in the second packaging portion 22. Since the second packaging portion 22 is located outside the receiving chamber 11, the heat generated during the operation of the diode chips 200 may be directly dissipated to the outside air via the second packaging portion 22 located outside the receiving chamber 11, thereby improving the heat dissipation performance of the photovoltaic junction box.

As shown in FIG. 1, each diode chip 200 electrically connects adjacent conductive terminals 100. A first electrode of the diode chip 200 is electrically connected to a first conductive terminal 100 via a wire 210 and a second electrode of the diode chip 200 is electrically connected directly to a second conductive terminal 100 adjacent to the first conductive terminal 100. The second electrode of the diode chip 200 is directly attached to a surface of the second conductive terminal 100 in a surface mounted manner.

Each conductive terminal 100, as shown in FIGS. 1 and 2, has a first portion directly packaged in the packaging portion 20 of the box body 10, 20 and a second portion exposed in the receiving chamber 11. A first electrical connection portion 100a adapted to be electrically connected to a first wire 1 is formed on the second portion of one conductive terminal 100 located at one end of the photovoltaic junction box. A second electrical connection portion 100b adapted to be electrically connected to a second wire 2 is formed on the second portion of another conductive terminal 100 located at the other end of the photovoltaic junction box. A third electrical connection portion 110 adapted to be electrically connected to a bus bar (not shown) from a solar panel is formed on the second portion of each of the conductive terminals 100. Since the first electrical connection portion 100a, the second electrical connection portion 100b, and the third electrical connection portion 110 are exposed in the receiving chamber 11, it is possible to solder the first wire 1, the second wire 2 and the bus bars onto the first electrical connection portion 100a, the second electrical connection portion 100b, and the third electrical connection portions 110, respectively.

Each conductive terminal 100 has a plurality of passageways 101 formed in the first portion, as shown in FIG. 1. In this way, after the first portion of the conductive terminal 100 is directly packaged in the box body 10, 20, the injection-molding material for forming the box body 10, 20 passes through the passageways 101 formed in the conductive terminal 100 such that the conductive terminals 100 are reliably secured to the box body 10, 20.

The receiving chamber 11, as shown in FIG. 3, may be closed by a cover 30 of the photovoltaic junction box. A resilient snap 32 is formed on one of the box body 10, 20 and the cover 30, and a recess 12 is formed on the other of the box body 10, 20 and the cover 30. The resilient snap 32 is adapted to be snapped into the corresponding recess 12 so as to lock the cover 30 on the box body 10, 20.

A photovoltaic junction box according to another embodiment is shown in FIGS. 4-7. The photovoltaic junction box comprises a box body 10', 20', a plurality of conductive terminals 100, and at least one diode chip 200. In the shown embodiment, the photovoltaic junction box comprises four conductive terminals 100 and three diode chips 200; the four conductive terminals 100 are arranged in a row. Like reference numbers indicate like elements and only the differences from the embodiment shown in FIGS. 1-3 will be described in detail herein.

Figure 4:
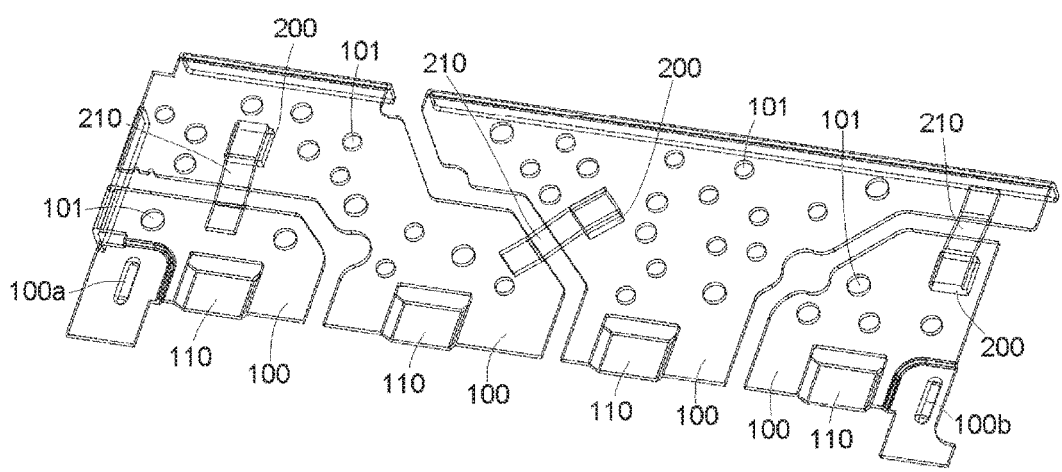
FIG. 4 is a perspective view of a plurality of conductive terminals and a plurality of diode chips of a photovoltaic junction box according to a second embodiment.
Figure 5:
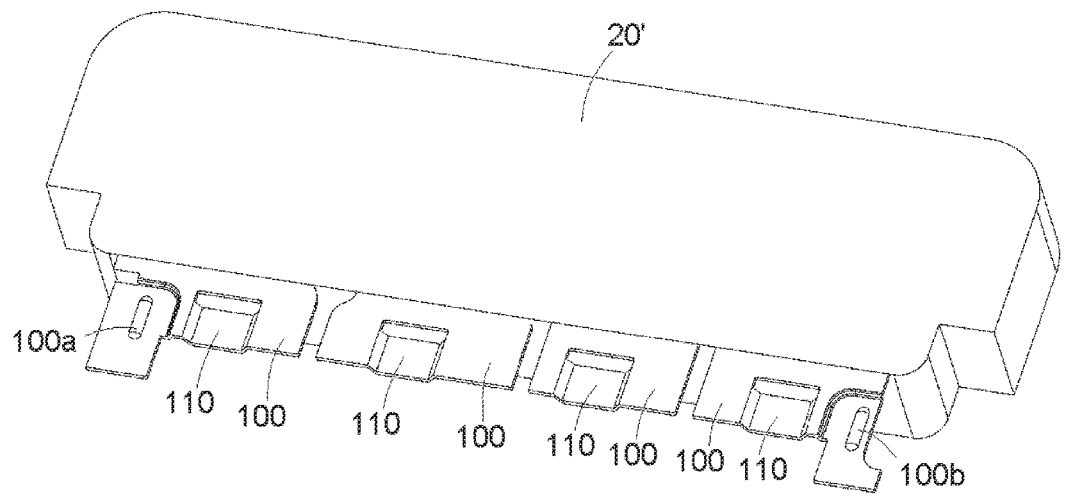
FIG. 5 is a perspective view of a package of the photovoltaic junction box of the second embodiment.
Figure 6:
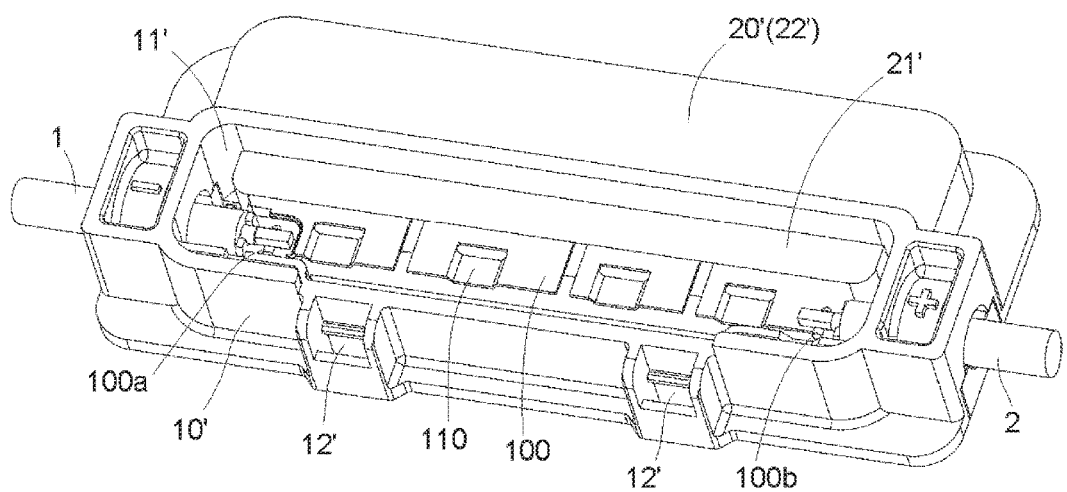
FIG. 6 is a perspective view of the photovoltaic junction box of the second embodiment in which a receiving chamber of the photovoltaic junction box is in an open state.

In the embodiment shown in FIGS. 5 and 6, the box body 10', 20' is an assembly part formed by two separated components. The box body 10', 20' mainly comprises a housing 10' and a package 20'. The receiving chamber 11' is defined in the housing 10'. The package 20' is assembled on the housing 10', for example, the package 20' may be bonded to the housing 10' by glue. An assembling opening is formed in a sidewall of the housing 10' and a first portion 21' of the package 20' is inserted into the receiving chamber 11' of the housing 10' through the assembling opening. A second portion 22' of the package 20' located outside the receiving chamber 11' may be bonded to the outer sidewall of the housing 10' by the glue. Each conductive terminal 100, as shown in FIGS. 4-6, comprises a first portion directly packaged in the package 20' of the box body 10', 20' and a second portion exposed in the receiving chamber 11'.

The box body 10', 20', as shown in FIGS. 4-6, may be separately molded from an injection-molding material in the insert-molding manner. A plurality of passageways 101 are formed in the first portion of each of the conductive terminals 100. In this way, after the first portion of the conductive terminal 100 is directly packaged in the package 20', the injection-molding material for forming the package 20' passes through the passageways 101 formed in the conductive terminal 100 such that the conductive terminals 100 are reliably coupled to the package 20'.

Figure 7:
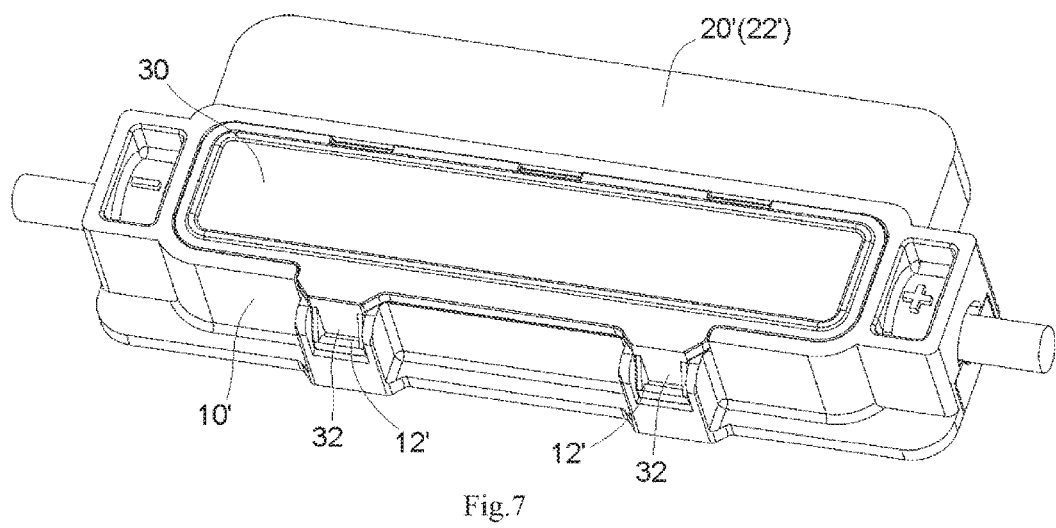
FIG. 7 is a perspective view of the photovoltaic junction box of FIG. 6 in which the receiving chamber is closed by a cover.

As shown in FIG. 7, in the illustrated embodiment, the photovoltaic junction box further comprises a cover 30 adapted to be mounted on the opening of the receiving chamber 11' of the box body 10', 20' so as to open or close the opening of the receiving chamber 11'.

What is claimed is:

1. A photovoltaic junction box, comprising:
    a box body is a single integrally-molded part having a housing portion defining a receiving chamber and a packaging portion having a first packaging portion located inside the receiving chamber and a second packaging portion located outside the receiving chamber;
    a plurality of conductive terminals positioned along the box body; and
    at least one diode chip disposed in a portion of the box body outside of the receiving chamber.

2. The photovoltaic junction box of claim 1, wherein the at least one diode chip is disposed in the second packaging portion.

3. The photovoltaic junction box of claim 2, wherein the at least one diode chip has a first electrode electrically connected to a first conductive terminal via a wire and a second electrode directly electrically connected to a second conductive terminal adjacent to the first conductive terminal.

4. The photovoltaic junction box of claim 3, wherein the second electrode is adapted to be soldered directly to a surface of the second conductive terminal.

5. The photovoltaic junction box of claim 1, wherein each conductive terminal of the plurality of conductive terminals has a first portion disposed in the packaging portion of the box body and a second portion exposed in the receiving chamber.

6. The photovoltaic junction box of claim 5, wherein a first conductive terminal disposed at a first end of the photovoltaic junction box adjacent to a first wire has a first electrical connection portion disposed on the second portion of the first conductive terminal and adapted to be electrically connected to the first wire.

7. The photovoltaic junction box of claim 6, wherein a second conductive terminal disposed at a second end of the photovoltaic junction box opposite the first end adjacent to a second wire has a second electrical connection portion disposed on the second portion of the second conductive terminal and adapted to be electrically connected to the second wire.

8. The photovoltaic junction box of claim 7, wherein each conductive terminal has a third electrical connection portion disposed on the second portion of the conductive terminal and adapted to be electrically connected.

9. The photovoltaic junction box of claim 1, wherein the box body includes a housing defining the receiving chamber and a package assembled with the housing.

10. The photovoltaic junction box of claim 9, wherein the at least one diode chip is disposed in the package.

11. The photovoltaic junction box of claim 10, wherein the package has a first portion disposed in the receiving chamber and a second portion located outside the receiving chamber, the at least one diode chip disposed in the second portion of the package.

12. The photovoltaic junction box of claim 11, wherein the at least one diode chip has a first electrode electrically connected to a first conductive terminal via a wire and a second electrode directly electrically connected to a second conductive terminal adjacent to the first conductive terminal.

13. The photovoltaic junction box of claim 12, wherein the second electrode is adapted to be soldered directly to a surface of the second conductive terminal.

14. The photovoltaic junction box of claim 10, wherein each conductive terminal of the plurality of conductive terminals has a first portion disposed in the package and a second portion exposed in the receiving chamber.

15. The photovoltaic junction box of claim 14, wherein a first conductive terminal disposed at a first end of the photovoltaic junction box has a first electrical connection portion disposed on the second portion of the first conductive terminal and adapted to be electrically connected to a first wire.

16. The photovoltaic junction box of claim 15, wherein a second conductive terminal disposed at a second end of the photovoltaic junction box opposite the first end has a second electrical connection portion disposed on the second portion of the second conductive terminal and adapted to be electrically connected to a second wire.

17. The photovoltaic junction box of claim 16, wherein each conductive terminal has a third electrical connection portion disposed on the second portion of the conductive terminal and adapted to be electrically connected.

18. The photovoltaic junction box of claim 1, further comprising a cover adapted to be mounted on an opening of the receiving chamber.

19. The photovoltaic junction box of claim 18, wherein one of the box body and the cover has a resilient snap and the other of the box body and the cover has a recess, the resilient snap engaging the recess to lock the cover on the box body.

20. The photovoltaic junction box of claim 1, wherein the box body is molded from an injection molding material.

21. The photovoltaic junction box of claim 20, wherein each of the plurality of conductive terminals has a first portion disposed in the box body and a second portion not disposed in the box body.

22. The photovoltaic junction box of claim 21, wherein the first portion of each of the conductive terminals has a plurality of passageways extending through the first portion, a portion of the box body extends through the passageways to secure the conductive terminals to the box body.

\* \* \* \* \*